US012772871B2

(12) United States Patent
Kreiter et al.

(10) Patent No.: US 12,772,871 B2
(45) Date of Patent: Oct. 20, 2026

(54) POWER ELECTRONIC DEVICE AND METHOD FOR FABRICATING THE SAME

(71) Applicant: Infineon Technologies AG, Neubiberg (DE)

(72) Inventors: Oliver Kreiter, Warstein (DE); Patrik Holt Jones, Soest (DE)

(73) Assignee: Infineon Technologies AG, Neubiberg (DE)

( * ) Notice: Subject to any disclaimer, the term of this patent is extended or adjusted under 35 U.S.C. 154(b) by 447 days.

(21) Appl. No.: 18/476,417

(22) Filed: Sep. 28, 2023

(65) Prior Publication Data

US 2024/0120309 A1 Apr. 11, 2024

(30) Foreign Application Priority Data

Oct. 10, 2022 (DE) ......................... 102022126082.8

(51) Int. Cl.

| | |
|---|---|
| ***H10W 70/40*** | (2026.01) |
| ***H10W 90/00*** | (2026.01) |
| *H10W 72/00* | (2026.01) |
| *H10W 72/60* | (2026.01) |
| *H10W 74/10* | (2026.01) |

(52) U.S. Cl.

CPC ......... *H10W 70/481* (2026.01); *H10W 90/00* (2026.01); *H10W 72/07653* (2026.01); *H10W 72/631* (2026.01); *H10W 74/10* (2026.01); *H10W 90/753* (2026.01); *H10W 90/763* (2026.01); *H10W 90/765* (2026.01)

(58) Field of Classification Search

CPC . H10W 70/481; H10W 90/00; H10W 90/763; H10W 90/753; H10W 90/765; H10W 72/07653; H10W 72/631; H10W 74/10

See application file for complete search history.

(56) References Cited

U.S. PATENT DOCUMENTS 6,046,641 A * 4/2000 Chawla .................. H03F 1/565 330/276
6,175,148 B1 * 1/2001 Schwarzbauer ........ H01L 24/72 257/667

(Continued)

FOREIGN PATENT DOCUMENTS

| | | | |
|---|---|---|---|
| DE | 112016007432 | T5 | 7/2019 |
| EP | 3956924 | A1 | 2/2022 |
| JP | 2013251500 | A | 12/2013 |

*Primary Examiner* — Sitaramarao S Yechuri
(74) *Attorney, Agent, or Firm* — Murphy, Bilak & Homiller, PLLC

(57) ABSTRACT

A power electronic device includes: a carrier having at least two die mounting areas; a power semiconductor die(s) mounted on the carrier at a first mounting area and having a first side facing the carrier and an opposite second side, a second die mounting area being free of any semiconductor die; and a contact clip arranged over the die and second die mounting area. The contact clip is at least partially arranged in a first plane, with a first part over the die being bent downwards such it is arranged in a second plane below the first plane and coupled to the second side of the die. A second part of the contact clip over the second die mounting area is bent upwards such that the second part is arranged in a third plane above the first plane, or is free of any bend and arranged in the first plane.

14 Claims, 4 Drawing Sheets

(56) References Cited

U.S. PATENT DOCUMENTS

| | | | | |
|---|---|---|---|---|
| 10,141,248 | B2 | 11/2018 | Muto et al. | |
| 2004/0007772 | A1* | 1/2004 | Arai | H01L 23/3135 257/691 |
| 2005/0087849 | A1* | 4/2005 | Morita | H01L 25/072 257/E25.016 |
| 2007/0216011 | A1* | 9/2007 | Otremba | H01L 23/49575 257/E23.044 |
| 2018/0342440 | A1 | 11/2018 | Nishiyama | |
| 2022/0115298 | A1* | 4/2022 | Shilimkar | H01L 23/66 |

* cited by examiner

POWER ELECTRONIC DEVICE AND METHOD FOR FABRICATING THE SAME

TECHNICAL FIELD

This disclosure relates in general to a power electronic device, in particular a power electronic device comprising a contact clip, as well as to a method for fabricating such a power electronic device.

BACKGROUND

Power electronic devices may be used in a variety of applications, wherein different applications may have different requirements regarding the operating voltage and/or the current. These different requirements can be addressed by providing different power electronic devices specifically designed for different operating voltages and/or currents. For example, a power electronic device for a lower power class may comprise less power semiconductor dies connected in parallel than a power electronic device for a higher power class. However, designing and fabricating several power electronic devices from the ground up which are just optimized for different power classes is not cost efficient. On the other hand, it may not be possible to simply reuse a design for a high voltage class and leave out one or more of the power semiconductor dies connected in parallel, as this could cause electrical and/or mechanical failures (e.g. because a contact clip and a carrier are not sufficiently isolated from one another at a position where a power semiconductor die is omitted). Improved power electronic devices and improved methods for fabricating power electronic devices may help with solving these and other problems.

The problem on which the invention is based is solved by the features of the independent claims. Further advantageous examples are described in the dependent claims.

SUMMARY

Various aspects pertain to a power electronic device, comprising: a carrier comprising at least two die mounting areas, each of the die mounting areas being configured to accept a power semiconductor die, at least one power semiconductor die mounted on the carrier at a first one of the die mounting areas, the power semiconductor die comprising a first side and an opposite second side, wherein the first side faces the carrier, wherein a second one of the die mounting areas is free of any semiconductor die, and a contact clip arranged over the power semiconductor die and over the second die mounting area, the contact clip being at least partially arranged in a first plane, wherein a first part of the contact clip over the power semiconductor die is bent downwards such that the first part is arranged in a second plane below the first plane and is coupled to the second side of the power semiconductor die, and wherein a second part of the contact clip over the second die mounting area is bent upwards such that the second part is arranged in a third plane above the first plane, or wherein the second part is free of any bend such that the second part is arranged in the first plane.

Various aspects pertain to a method for fabricating a power electronic device, the method comprising: providing a carrier comprising at least two die mounting areas, each of the die mounting areas being configured to accept a power semiconductor die, mounting at least one power semiconductor die on the carrier at a first one of the die mounting areas, the power semiconductor die comprising a first side and an opposite second side, wherein the first side faces the carrier, leaving a second one of the die mounting areas free of any semiconductor die, and arranging a contact clip over the power semiconductor die and over the second die mounting area such that the contact clip is at least partially arranged in a first plane, wherein a first part of the contact clip over the power semiconductor die is bent downwards such that the first part is arranged in a second plane below the first plane and is coupled to the second side of the power semiconductor die, and wherein a second part of the contact clip over the second die mounting area is bent upwards such that the second part is arranged in a third plane above the first plane, or wherein the second part is free of any bend such that the second part is arranged in the first plane.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, known structures and elements are shown in schematic form in order to facilitate describing one or more aspects of the disclosure. In this regard, directional terminology, such as “top”, “bottom”, “left”, “right”, “upper”, “lower” etc., is used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms “include”, “have”, “with” or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a power electronic device described below may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, power integrated circuits, etc.

An efficient power electronic device as well as an efficient method for fabricating a power electronic device may for example reduce material consumption, ohmic losses, chemical waste, etc. and may thus enable energy and/or resource savings. Improved power electronic devices as well as improved methods for fabricating a power electronic device, as specified in this description, may thus at least indirectly contribute to green technology solutions, i.e. climate-friendly solutions providing a mitigation of energy and/or resource use.

Figure 1A:
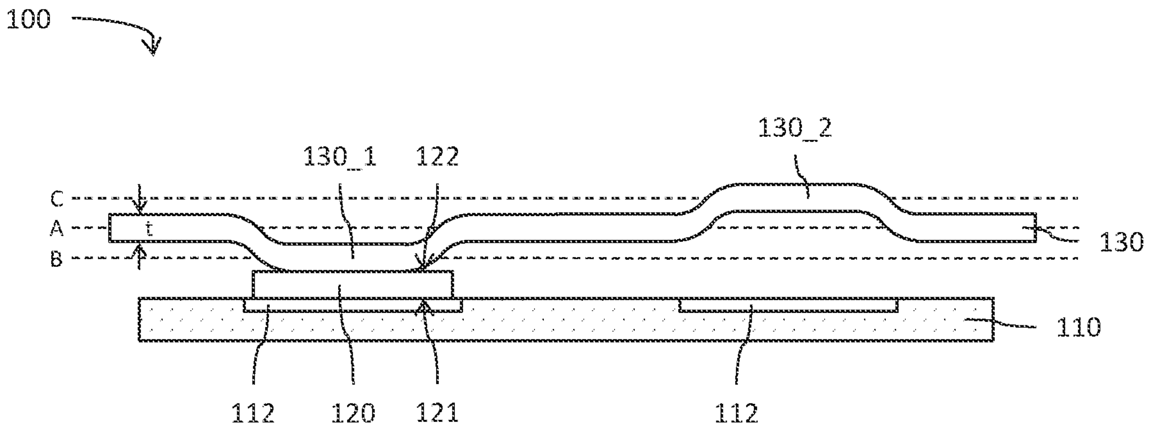
FIGS. 1A and 1B show sectional views of a power electronic device, wherein a particular die mounting area is left free of any power semiconductor die and wherein a contact clip is bent away (FIG. 1A) or at least not bent downwards (FIG. 1B) over this particular die mounting area.

FIG. 1A shows a sectional view of a power electronic device 100 comprising a carrier 110, a power semiconductor die 120 and a contact clip 130. The power electronic device 100 may for example comprise or consist of a semiconductor package or a semiconductor module.

The power electronic device 100 may be configured to operate with a high electrical voltage and/or a strong current. The power electronic device 100 may comprise any suitable electrical circuitry, for example a converter circuit, an inverter circuit, a half bridge circuit, etc. The power electronic device 100 may for example be configured for use in automotive applications.

The carrier 110 may comprise or consist of a power electronic substrate, for example a substrate of the type direct copper bond (DCB), direct aluminum bond (DAB), active metal braze (AMB), insulated metal substrate (IMS), leadframe, etc. The carrier 110 may e.g. comprise or consist of Al, Ag, Au, or Cu. The carrier 110 may have any suitable dimensions. For example, the carrier 110 may have a width and/or a length of 1 cm or more, or 5 cm or more, or 10 cm or more. The carrier 110 may e.g. have a thickness of 250 μm or more, or 500 μm or more, or 1 mm or more, or 5 mm or more.

The carrier 110 comprises at least two die mounting areas 112, wherein each one of the die mounting areas 112 is configured to accept a power semiconductor die. "Configured to accept a power semiconductor die" may mean that a power semiconductor die can be joined to the carrier 110 at a die mounting area 112. This may, e.g., entail soldering the power semiconductor die to the die mounting area 112 (which therefore comprises a material that can be part of a solder joint). In the case that the carrier 110 comprises both electrically conductive components (or layers) and electrically isolating components (or layers), like a DCB, the die mounting areas 112 may for example be electrically conductive regions of sufficient size to accept a power semiconductor die.

According to an example, the die mounting areas 112 are partially or completely surrounded by an electrically conductive region. The die mounting areas 112 and the surrounding region may in particular be part of the same electrically conductive layer of the carrier 110. The electrically conductive layer may in particular be an unstructured layer. According to another example, the electrically conductive layer is a structured layer. According to an example, any part of the surface of the carrier 110 that is outside of the die mounting areas 112 is not configured (or not suitable) to accept a power semiconductor die. According to a specific example, such parts may be essentially electrically isolating.

The die mounting areas 112 may all have the same size and/or the same shape or the die mounting areas 112 may have different sizes and/or different shapes. The die mounting areas 112 may for example have a length and a width of 1 mm or more, or 2 mm or more, or 3 mm or more, or 1 cm or more, or 3 cm or more.

The carrier 110 may comprise any suitable number of die mounting areas 112, for example two, three, four, five, six, seven, eight, etc. The die mounting areas 112 may all be arranged on the same side of the carrier 110. However, it is also possible that die mounting areas are arranged on opposite sides of the carrier 110. The die mounting areas 112 may be arranged in a regular pattern, e.g. in a matrix. However, it is also possible that the die mounting areas 112 are arranged on the carrier 110 without a regular pattern.

The at least one power semiconductor die 120 is mounted on the carrier 110 at a first one of the die mounting areas 112. The power semiconductor die 120 comprises a first side 121 and an opposite second side 122. The power semiconductor die 120 is arranged on the carrier 110 such that the first side 121 faces the carrier 110.

The power semiconductor die 120 may for example comprise a first power electrode (e.g. a drain electrode or a collector electrode) on the first side 121 and a second power electrode (e.g. a source electrode or an emitter electrode) on the second side 122. The power semiconductor die 120 may also comprise a control electrode (e.g. a gate electrode) which may e.g. be arranged on the second side 122.

According to an example, the power electronic device 100 comprises more than one power semiconductor die 120, e.g. two, three, four, five, etc. power semiconductor dies 120. In this case, the power semiconductor dies 120 may all be the same type of die. It is however also possible that the power electronic device 100 comprises different types of power semiconductor dies 120. Furthermore, the power semiconductor dies 120 may be arranged on the die mounting areas 112 in any suitable pattern. Exemplary patterns are described further below with respect to FIGS. 2A-2C.

The at least one power semiconductor die 120 may have any suitable dimensions. In particular, the at least one power semiconductor die 120 may for example have a thickness (measured perpendicular to the first and second sides 121, 122) of 50 μm or more, or 100 μm or more, or 150 μm or more, or 200 μm or more, or 250 μm or more. A width and a length of the at least one power semiconductor die 120 may be about equal to or smaller than the width and length of the corresponding die mounting area 112.

As shown in FIG. 1A, a second one of the die mounting areas 112 is free of any semiconductor die. In the case that the power electronic device 100 comprises more than two die mounting areas 112, any number of die mounting areas 112 may be free of a semiconductor die.

The contact clip 130 is arranged over the at least one power semiconductor die 120 and over the second one of the die mounting areas 112. The contact clip 130 is at least partially arranged in a first plane (plane A in FIG. 1A). As shown in FIG. 1A, a first part 130_1 of the contact clip 130 over the power semiconductor die 120 is bent downwards such that the first part 130_1 is arranged in a second plane (plane B) below the first plane and is coupled to the second side 122 of the power semiconductor die 120.

Furthermore, a second part 130_2 of the contact clip 130 over the second one of the die mounting areas 112 (wherein the second one of the die mounting areas 112 is free of any semiconductor die) is bent upwards such that the second part 130_2 is arranged in a third plane (plane C) above the first plane.

According to an example, no part of the contact clip 130 that is arranged within a circumference of the carrier 110 and that is not coupled to a semiconductor die (like the first part 130_1) or to the carrier 110 is arranged below the first plane. In other words, all parts of the contact clip 130 that are not coupled to a die or to the carrier 110 have a minimum distance to the carrier that is defined by the distance between the first plane (plane A) and the upper surface of the carrier 110.

The contact clip 130 may comprise a lowered first part 130_1 over each of the power semiconductor dies 120 that the contact clip 130 is coupled to. Similarly, the contact clip 130 may comprise a raised second part 130_2 over each die mounting area 112 that is free of any semiconductor die.

According to an example, the first part 130_1 and the second part 130_2 of the contact clip have the same dimensions and/or the same (but mirrored) shape.

The contact clip 130 may comprise or consist of any suitable material or material composition. For example, the contact clip 130 may comprise or consist of Al, Ag, or Cu. The contact clip 130 may for example be a leadframe part. The contact clip 130 may have any suitable thickness, for example a thickness t in the range of 100 μm to 500 μm, for example about 250 μm.

A distance between the first plane (plane A) and the second plane (plane B) may for example be 50 μm or more, or 100 μm or more, or 200 μm or more, or 300 μm or more, or 500 μm or more, or 800 μm or more. A distance between the first plane and the third plane (plane C) may be in a similar range. It is possible but not necessary that the distance between the first and second planes is the same as the distance between the first and third planes.

Figure 1B:
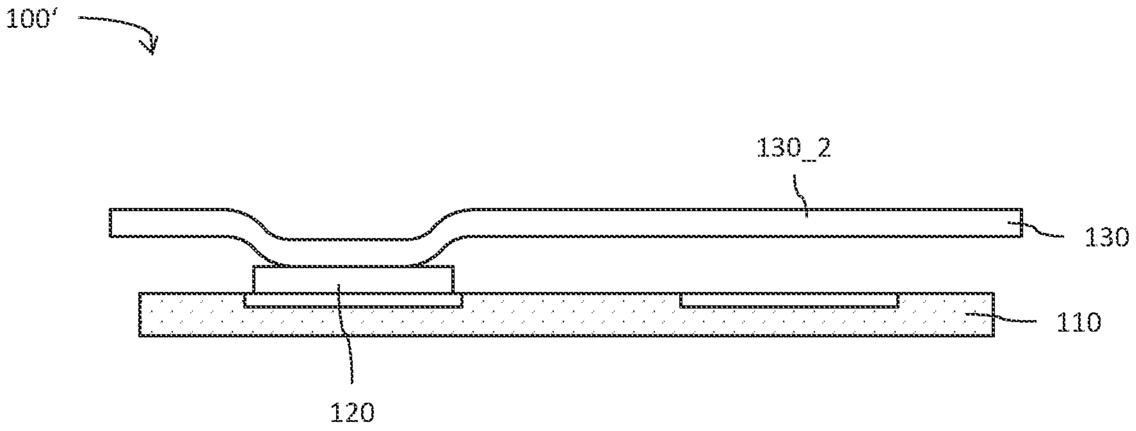

FIG. 1B shows a sectional view of a further power electronic device 100' which may be similar or identical to the power electronic device 100, except for the differences described in the following.

In the power electronic device 100', the second part 130_2 of the contact clip 130 is not arranged in the third plane. Instead, the second part 130_2 is free of any bend such that the second part 130_2 is arranged in the first plane.

A power electronic device like the power electronic devices 100 and 100' may be equipped with a different number of power semiconductor dies 120, depending on the power class of the specific application (reducing the number of power semiconductor dies 120 connected in parallel may reduce the power class of the power electronic device 100 or 100').

For example, the power electronic device 100 or 100' may be configured to comprise up to six power semiconductor dies 120 arranged on the carrier 110 and connected in parallel by the contact clip 120. An exemplary application, however, may only require a device with three power semiconductor dies 120. It would not be cost efficient to design a new device for this application. Instead, it would be desirable to use the carrier and the contact clip of the device for six dies and simply leave out three of the dies. However, in this case the contact clip would comprise a lowered first part 130_1 over all of the die mounting areas 112, including the die mounting areas 112 that are left empty. The gap between the first part 130_1 and an empty die mounting area 112 may be so thin that liquid mold material cannot flow into the gap which in turn may create an incomplete electrical isolation between the contact clip 130 and the carrier 110.

The power electronic devices 100 and 100' use a standardized layout for the carrier 110 and the contact clip 130. An adaption to a different power level comprises leaving out one or more of the power semiconductor dies 120 and bending up the contact clip 130 over the empty die mounting area(s) 112, as in the power electronic device 100, or not bending the contact clip 130 at all over the empty die mounting area(s) 112, as in the power electronic device 100'. This alteration in the production process may be comparatively easy to implement and may therefore be cost efficient compared to using an adapted carrier design and/or an adapted contact clip design.

According to an example, the power electronic device 100 comprising the second part 130_2 may have better mechanical stability and/or better electrical isolation compared to the power electronic device 100'.

Figure 2A:
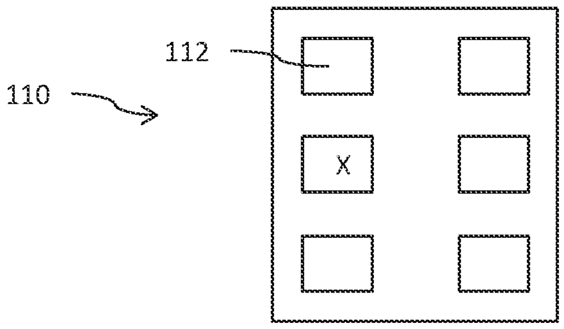
FIGS. 2A to 2C show plan views of a carrier with an array of die mounting areas, wherein one or more of the die mounting areas are to be left free of any power semiconductor die.
Figure 2B:
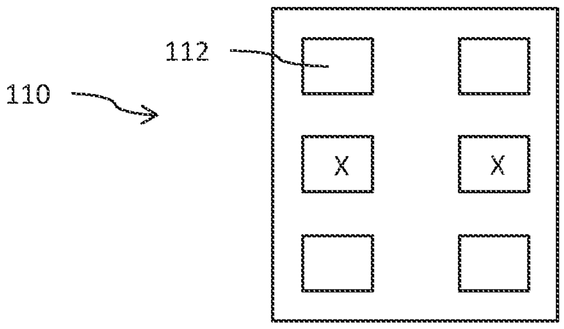
Figure 2C:
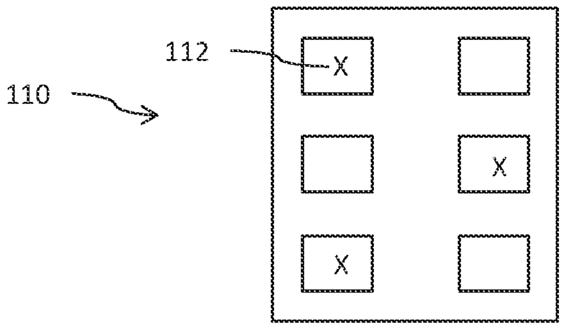

FIGS. 2A to 2C show a plan view of the carrier 110 comprising six die mounting areas 112 according to three specific examples. The six die mounting areas 112 are arranged on the carrier 110 in a matrix. Die mounting areas 112 which are to be left free of any semiconductor die during fabrication of a power electronic device are marked with an "X".

In the example shown in FIG. 2A, one die mounting area 112 is to be left free (in other words, the power electronic device shall comprise five power semiconductor dies 120 instead of six). In the example shown in FIG. 2B, two die mounting areas 112 are to be left free and in the example shown in FIG. 2C, three die mounting areas 112 are to be left free. FIGS. 2A-2C show exemplary arrangements of free die mounting areas 112 and die mounting areas 112 that are to comprise a power semiconductor die 120. Other arrangements are possible. For device symmetry reasons, for reasons of electrical performance and/or for reasons of mechanical stability of the contact clip 130, the symmetrical arrangements shown in FIGS. 2A-2C may be beneficial.

Figure 3:
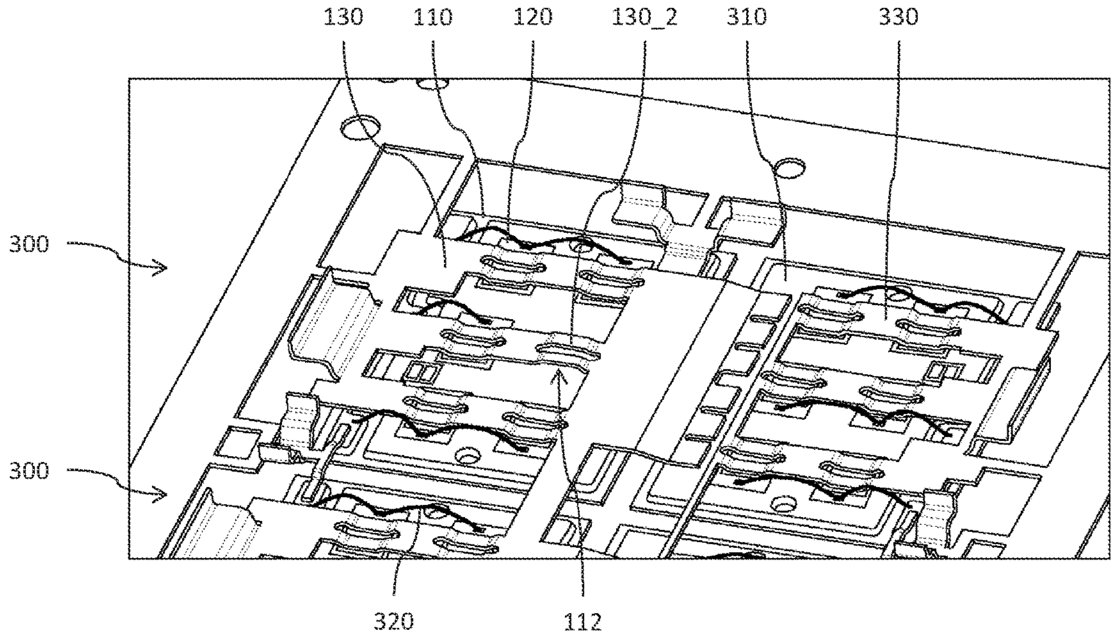
FIG. 3 shows a perspective view of a further power electronic device which comprises two carriers and two contact clips.

FIG. 3 shows a perspective view of two power electronic devices 300 which may be similar or identical to the power electronic device 100 or 100', except for the differences described in the following (only part of the lower one of the power electronic devices 300 is shown in FIG. 3). FIG. 3 in particular shows the power electronic devices 300 during fabrication while the contact clip 130 is still an integral part of a leadframe.

The power electronic device 300 may comprise all components described with respect to the power electronic devices 100 and 100'. Furthermore, the power electronic device 300 may comprise a second carrier 310 which may be arranged side-by-side with the carrier 110. Additional power semiconductor dies 120 are arranged on the second carrier 310. Furthermore, a distal end of the contact clip 130 is coupled to the second carrier 310.

According to an example, the power semiconductor dies 120 on both carriers 110, 310 are identical. According to an example, the carrier 110 and the second carrier 310 are of the same type and/or have the same dimensions and/or essentially have the same design. This may save costs.

According to an example, the power semiconductor dies 120 on the carrier 110, respectively on the second carrier 310 may form the two sides of a half bridge circuit.

The power electronic device 300 furthermore comprises a plurality of electrical connectors 320 which may for example comprise bond wires. The electrical connectors 320 may be coupled to gate electrodes of the power semiconductor dies 120.

As shown in FIG. 3, one of the die mounting areas 112 on the carrier 110 is free of any semiconductor die and the contact clip 130 is bent upwards over this die mounting area 112, forming a raised second part 130_2. According to another example, the contact clip 130 is free of any bend over this die mounting area 112, as explained with respect to FIG. 1B.

In FIG. 3, the second carrier 310 does not comprise any die mounting area 112 that is free of any semiconductor die. However, it is possible that this is the case. For example, the second carrier 310 may comprise the same number of empty die mounting areas 112 (and conversely, the same number of power semiconductor dies 120) as the carrier 110.

The power electronic device 300 furthermore comprises a second contact clip 330 which is arranged over and coupled to the power semiconductor dies 120 on the second carrier 310. As shown in FIG. 3, the second contact clip 330 comprises the lowered first parts 130_1. The second contact clip 330 may of course also comprise the raised second parts 130_2. According to the example shown in FIG. 3, the contact clip 130 and the second contact clip 330 are part of the same leadframe.

Figure 4:
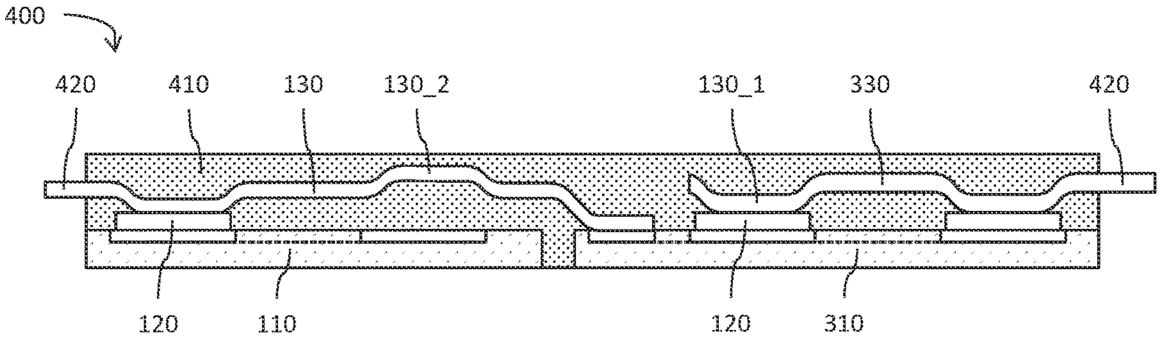
FIG. 4 shows a sectional view of a further power electronic device, wherein a molded body is arranged at least partially between a contact clip and a carrier.

FIG. 4 shows a sectional view of a further power electronic device 400 which may be similar or identical to the power electronic device 100, 100', or 300, except for the differences described in the following.

The power electronic device 400 comprises a molded body 410 at least partially encapsulating the power semiconductor dies 120. The molded body 410 may be fabricated using any suitable molding process, for example compression molding, injection molding, or transfer molding. The molded body 410 may comprise inorganic filler particles configured to reduce the thermal resistance of the molded body 410.

The molded body 410 may be configured to electrically isolate the contact clips 130, 330 from the carriers 110, 310. As shown in FIG. 4, within a circumference of the respective carrier 110, 310 the molded body 410 completely covers an underside of the respective contact clip 130, 330, except for the first parts 130_1 (which are arranged over and coupled to the power semiconductor dies 120).

According to an example, the molded body 410 may also at least partially encapsulate the contact clip 130 and the second contact clip 330. However, it is possible that the contact clip 130 and/or the second contact clip 330 are at least partially exposed from the molded body 410. For example, distal ends of the contact clips 130, 330 may be exposed from the molded body 410 in order to provide external contacts 420.

According to an example, the die mounting areas 112 are part of an unstructured conductive layer as described further above (this is indicated by the doted lines in FIG. 4). According to another example, the electrically conductive layer is a structured layer.

Figure 5:
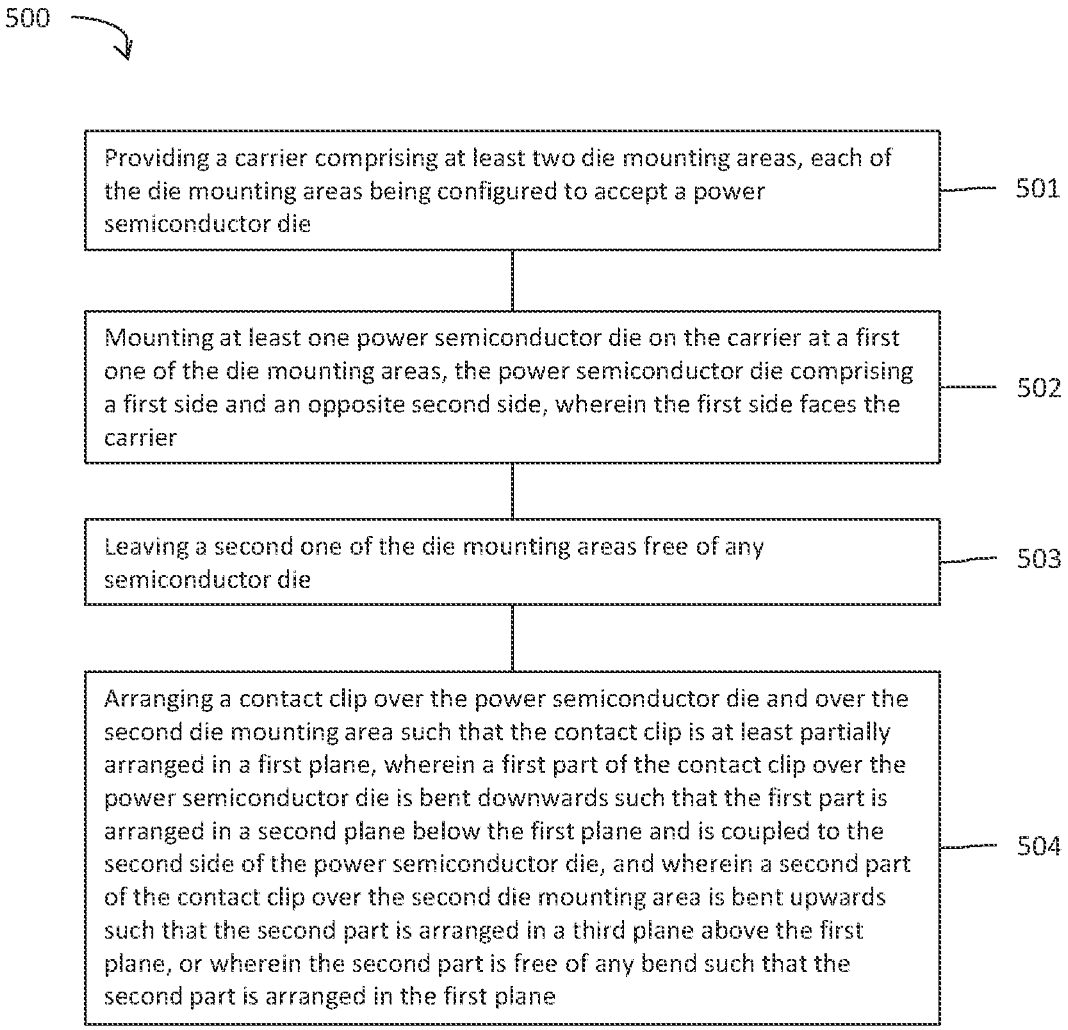
FIG. 5 is a flow chart of an exemplary method for fabricating a power electronic device.

FIG. 5 is a flow chart of a method 500 for fabricating a power electronic device. The method 500 may for example be used to fabricate the power electronic devices 100 to 400.

The method 500 comprises at 501 a process of providing a carrier comprising at least two die mounting areas, each of the die mounting areas being configured to accept a power semiconductor die, at 502 a process of mounting at least one power semiconductor die on the carrier at a first one of the die mounting areas, the power semiconductor die comprising a first side and an opposite second side, wherein the first side faces the carrier, at 503 a process of leaving a second one of the die mounting areas free of any semiconductor die, and at 504 a process of arranging a contact clip over the power semiconductor die and over the second die mounting area such that the contact clip is at least partially arranged in a first plane, wherein a first part of the contact clip over the power semiconductor die is bent downwards such that the first part is arranged in a second plane below the first plane and is coupled to the second side of the power semiconductor die, and wherein a second part of the contact clip over the second die mounting area is bent upwards such that the second part is arranged in a third plane above the first plane, or wherein the second part is free of any bend such that the second part is arranged in the first plane.

According to an example, the method 500 comprises a process of bending the contact clip in order to provide the lowered first part and/or the raised second part. This may e.g. comprise a stamping process.

In the following, the power electronic device and the method for fabricating a power electronic device are further explained using specific examples.

Example 1 is a power electronic device, comprising: a carrier comprising at least two die mounting areas, each of the die mounting areas being configured to accept a power semiconductor die, at least one power semiconductor die mounted on the carrier at a first one of the die mounting areas, the power semiconductor die comprising a first side and an opposite second side, wherein the first side faces the carrier, wherein a second one of the die mounting areas is free of any semiconductor die, and a contact clip arranged over the power semiconductor die and over the second die mounting area, the contact clip being at least partially arranged in a first plane, wherein a first part of the contact clip over the power semiconductor die is bent downwards such that the first part is arranged in a second plane below the first plane and is coupled to the second side of the power semiconductor die, and wherein a second part of the contact clip over the second die mounting area is bent upwards such that the second part is arranged in a third plane above the first plane, or wherein the second part is free of any bend such that the second part is arranged in the first plane.

Example 2 is the power electronic device of example 1, further comprising: a molded body encapsulating the power semiconductor die, wherein the molded body electrically isolates the contact clip from the carrier.

Example 3 is the power electronic device of example 2, wherein within a circumference of the carrier, the molded body completely covers an underside of the contact clip, wherein the underside faces the carrier, except for those parts of the underside of the contact clip that are arranged over the at least one power semiconductor die.

Example 4 is the power electronic device of example 2 or 3, wherein a distal end of the contact clip is exposed from the molded body and forms an external contact of the power electronic device.

Example 5 is the power electronic device of one of the preceding examples, wherein the carrier comprises at least four die mounting areas, wherein the die mounting areas are arranged in an array, and wherein the contact clip is arranged over all of the at least four die mounting areas.

Example 6 is the power electronic device of example 5, wherein a third one of the die mounting areas is free of any semiconductor die, wherein a part of the contact clip over the third die mounting area is bent upwards such that the part is arranged in the third plane, or wherein the part is free of any bend such that the part is arranged in the first plane.

Example 7 is the power electronic device of one of the preceding examples, wherein the power electronic device comprises at least two power semiconductor dies, wherein the power semiconductor dies are connected in parallel by the contact clip.

Example 8 is the power electronic device of one of the preceding examples, further comprising: a second carrier, wherein the contact clip electrically couples the at least one power semiconductor die to the second carrier.

Example 9 is the power electronic device of example 8, wherein the second carrier comprises an identical layout of die mounting areas as the first carrier.

Example 10 is the power electronic device of one of the preceding examples, wherein a minimum distance between the carrier and the contact clip outside of the first part of the contact clip is 200 μm or more.

Example 11 is the power electronic device of one of the preceding examples, wherein a distance between the first plane and the second plane is 50 μm or more.

Example 12 is the power electronic device of example 11, wherein a distance between the first plane and the third plane is equal to the distance between the first plane and the second plane.

Example 13 is the power electronic device of one of the preceding examples, wherein the contact clip comprises or consists of a leadframe part.

Example 14 is the power electronic device of one of the preceding examples, wherein the carrier comprises or consists of a substrate of the type direct copper bond, direct aluminum bond, active metal braze, insulated metal substrate, or leadframe.

Example 15 is a method for fabricating a power electronic device, the method comprising: providing a carrier comprising at least two die mounting areas, each of the die mounting areas being configured to accept a power semiconductor die, mounting at least one power semiconductor die on the carrier at a first one of the die mounting areas, the power semiconductor die comprising a first side and an opposite second side, wherein the first side faces the carrier, leaving a second one of the die mounting areas free of any semiconductor die, and arranging a contact clip over the power semiconductor die and over the second die mounting area such that the contact clip is at least partially arranged in a first plane, wherein a first part of the contact clip over the power semiconductor die is bent downwards such that the first part is arranged in a second plane below the first plane and is coupled to the second side of the power semiconductor die, and wherein a second part of the contact clip over the second die mounting area is bent upwards such that the second part is arranged in a third plane above the first plane, or wherein the second part is free of any bend such that the second part is arranged in the first plane.

Example 16 is the method of example 15, further comprising: encapsulating the power semiconductor die with a molded body such that within a circumference of the carrier, the molded body completely covers an underside of the contact clip, wherein the underside faces the carrier, except for those parts of the underside of the contact clip that are arranged over the at least one power semiconductor die.

Example 17 is an apparatus comprising means for performing the method according to example 15 or 16.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power electronic device, comprising:

a carrier comprising at least two die mounting areas, each of the die mounting areas being configured to accept a power semiconductor die;

at least one power semiconductor die mounted on the carrier at a first one of the die mounting areas, the power semiconductor die comprising a first side and an opposite second side, wherein the first side faces the carrier, wherein a second one of the die mounting areas is free of any semiconductor die;

a contact clip arranged over the power semiconductor die and over the second die mounting area, the contact clip being at least partially arranged in a first plane; and a second carrier, wherein the contact clip electrically couples the at least one power semiconductor die to the second carrier, wherein the second carrier comprises an identical layout of die mounting areas as the first carrier, wherein a first part of the contact clip over the power semiconductor die is bent downwards such that the first part is arranged in a second plane below the first plane and is coupled to the second side of the power semiconductor die, wherein a second part of the contact clip over the second die mounting area is bent upwards such that the second part is arranged in a third plane above the first plane, or the second part is free of any bend such that the second part is arranged in the first plane.

2. The power electronic device of claim 1, further comprising:

a molded body encapsulating the power semiconductor die, wherein the molded body electrically isolates the contact clip from the carrier.

3. The power electronic device of claim 2, wherein within a circumference of the carrier, the molded body completely covers an underside of the contact clip, and wherein the underside faces the carrier, except for those parts of the underside of the contact clip that are arranged over the at least one power semiconductor die.

4. The power electronic device of claim 2, wherein a distal end of the contact clip is exposed from the molded body and forms an external contact of the power electronic device.

5. The power electronic device of claim 1, wherein the carrier comprises at least four die mounting areas, wherein the die mounting areas are arranged in an array, and wherein the contact clip is arranged over all of the at least four die mounting areas.

6. The power electronic device of claim 5, wherein a third one of the die mounting areas is free of any semiconductor die, wherein a third part of the contact clip over the third die mounting area is bent upwards such that the third part is arranged in the third plane, or the third part is free of any bend such that the third part is arranged in the first plane.

7. The power electronic device of claim 1, wherein the power electronic device comprises at least two power semiconductor dies connected in parallel by the contact clip.

8. The power electronic device of claim 1, wherein a minimum distance between the carrier and the contact clip outside of the first part of the contact clip is 200 μm or more.

9. The power electronic device of claim 1, wherein a distance between the first plane and the second plane is 50 μm or more.

10. The power electronic device of claim 9, wherein a distance between the first plane and the third plane is equal to the distance between the first plane and the second plane.

11. The power electronic device of claim 1, wherein the contact clip comprises a leadframe part.

12. The power electronic device of claim 1, wherein the carrier comprises a substrate of the type direct copper bond, direct aluminum bond, active metal braze, insulated metal substrate, or leadframe.

13. A method for fabricating a power electronic device, the method comprising:

providing a carrier comprising at least two die mounting areas, each of the die mounting areas being configured to accept a power semiconductor die;

mounting at least one power semiconductor die on the carrier at a first one of the die mounting areas, the power semiconductor die comprising a first side and an opposite second side, wherein the first side faces the carrier;

leaving a second one of the die mounting areas free of any semiconductor die; and arranging a contact clip over the power semiconductor die and over the second die mounting area such that the contact clip is at least partially arranged in a first plane;

providing a second carrier; and electrically coupling the at least one power semiconductor die to the second carrier via the contact clip, wherein the second carrier comprises an identical layout of die mounting areas as the first carrier, wherein a first part of the contact clip over the power semiconductor die is bent downwards such that the first part is arranged in a second plane below the first plane and is coupled to the second side of the power semiconductor die, wherein a second part of the contact clip over the second die mounting area is bent upwards such that the second part is arranged in a third plane above the first plane, or the second part is free of any bend such that the second part is arranged in the first plane.

14. The method of claim 13, further comprising:

encapsulating the power semiconductor die with a molded body such that within a circumference of the carrier, the molded body completely covers an underside of the contact clip, wherein the underside faces the carrier, except for those parts of the underside of the contact clip that are arranged over the at least one power semiconductor die.

* * * * *